(12) United States Patent
Kuznicki et al.

(10) Patent No.: US 10,020,408 B2
(45) Date of Patent: Jul. 10, 2018

(54) SYSTEM OF ARCHITECTURE AND RELATED BUILT-IN NANOMEMBRANES FOR THE EMITTER OF A LIGHT-TO-ELECTRICITY ALL-SILICON CONVERTER FOR THE GIANT PHOTOCONVERSION AND THE METHOD OF ITS MANUFACTURE

(71) Applicant: SEGTON ADT SAS, Versailles (FR)

(72) Inventors: Zbigniew Kuznicki, Hoenheim (FR); Patrick Meyrueis, Strasbourg (FR)

(73) Assignee: SEGTON ADVANCED TECHNOLOGY, Versailles (FR)

( * ) Notice: Subject to any disclaimer, the term of this patent is extended or adjusted under 35 U.S.C. 154(b) by 85 days.

(21) Appl. No.: 14/904,118

(22) PCT Filed: Jul. 21, 2014

(86) PCT No.: PCT/IB2014/002295
§ 371 (c)(1),
(2) Date: Jan. 11, 2016

(87) PCT Pub. No.: WO2015/008161
PCT Pub. Date: Jan. 22, 2015

(65) Prior Publication Data
US 2016/0155869 A1    Jun. 2, 2016

Related U.S. Application Data

(60) Provisional application No. 61/906,468, filed on Nov. 20, 2013, provisional application No. 61/856,080, filed on Jul. 19, 2013.

(51) Int. Cl.
*H01L 31/0352* (2006.01)
*H01L 31/0288* (2006.01)
(Continued)

(52) U.S. Cl.
CPC .... *H01L 31/035218* (2013.01); *H01L 31/028* (2013.01); *H01L 31/0288* (2013.01);
(Continued)

(58) Field of Classification Search
CPC ................................................ H01L 31/035218
See application file for complete search history.

(56) References Cited

U.S. PATENT DOCUMENTS 5,935,345 A      8/1999  Kuznicki
9,722,121 B2 *   8/2017  Kuznicki ............. H01L 31/065
(Continued)

FOREIGN PATENT DOCUMENTS

WO   WO 2010/089624    8/2010
WO   WO 2012/131496    10/2012

OTHER PUBLICATIONS

Electronic Transport in Mind Model Solar Cells: Collection Efficiency in the Presence of a A—Si/C—Si Heterointerfaces—M Ley et al—May 2002.

*Primary Examiner* — Eugene Lee
(74) *Attorney, Agent, or Firm* — Law Offices of Steven W. Weinrieb (57) ABSTRACT

Architecture of the light-to-electricity converter characterized in that the system of amorphized nanograins, preferentially nanograins of amorphized silicon, of any shape are optimally spread within the crystalline host material, preferentially crystalline silicon that are wrapped around with a metamaterial seg-matter nanolayer, characterized by secondary generation centers, called segtons, that are conditioned around divacancies and disposed entirely or only partly within the volume of the emitter, this volume being limited at each end by a nanomembrane assuming the appropriate exploitation of the lower-energy secondary gen-
(Continued)

eration through the giant photoconversion involving hot electrons, segtons, and seg-matter.

18 Claims, 4 Drawing Sheets

(51) Int. Cl.
*H01L 31/036* (2006.01)
*H01L 31/068* (2012.01)
*H01L 31/18* (2006.01)
*H01L 31/20* (2006.01)
*H01L 31/028* (2006.01)
*H01L 31/0376* (2006.01)

(52) U.S. Cl.
CPC ........ *H01L 31/036* (2013.01); *H01L 31/0352* (2013.01); *H01L 31/03762* (2013.01); *H01L 31/035236* (2013.01); *H01L 31/068* (2013.01); *H01L 31/1804* (2013.01); *H01L 31/202* (2013.01); *Y02E 10/547* (2013.01); *Y02P 70/521* (2015.11)

(56) References Cited

U.S. PATENT DOCUMENTS

2014/0224305 A1* 8/2014 Nagashima ........... H01L 31/055
　　　　　　　　　　　　　　　　　　　　136/254
2015/0333201 A1* 11/2015 Sargent ............... H01L 31/0324
　　　　　　　　　　　　　　　　　　　　136/250

* cited by examiner

FIG. 3a a-Si/<c-Si>
nanomembranes c-Si/<c-Si>
nanomembranes

FIG. 3b planar nanomembrane

FIG. 3c curved nanomembrane

SYSTEM OF ARCHITECTURE AND RELATED BUILT-IN NANOMEMBRANES FOR THE EMITTER OF A LIGHT-TO-ELECTRICITY ALL-SILICON CONVERTER FOR THE GIANT PHOTOCONVERSION AND THE METHOD OF ITS MANUFACTURE

1. DEFINITION OF THE INVENTION

This invention relies on a specific architecture of, preferentially, an all-silicon light-to-electricity converter, which exploits the giant photoconversion with an arrangement of buried efficient subregions, subsystems or substructures containing a nanoscale layered system with a silicon metamaterial we call "seg-matter". The manufacturing process to produce it is also described.

The invention relates to built-in nanomembranes, which provide the benefit of a new degree of liberty. These built-in nanomembranes form active subsystems with specific additional properties within the surrounding semiconductor.

The invention relates also to a method for exploiting secondary low-energy generation and multiplication of collectable additional carriers in light-to-electricity converters in general and particularly in the presented case of all-silicon converters for solar radiation.

2. DEFINITIONS OF TERMS AND EXPRESSIONS

The following definitions and abbreviations are used in the description.

Metamaterial refers to an artificial material, in the present case a derivative of silicon, that shows significantly different physical properties compared to those of the corresponding natural material all the while retaining its original chemical composition. More specifically, it can be a continuous or discontinuous layer, but also a field of pearls or grains of any shape and which is designed here to have a high optical absorption, a strong optical nonlinearity, a low-energy secondary generation/conversion, a low-energy multiplication of free-carriers, particularly electrons, and a specific electron transport.

Segton is a unit of the Secondary Electron Generation Tuned On Nanoscale, i.e., a conditioned elemental entity with its own system of electron energy levels for an efficient multistage light-to-electricity conversion. It takes advantage of low-energy photogeneration and multiplication of additional free-carriers, preferentially electrons, as described and protected by pending patents. More generally, it also allows a superposition of a highly useful set of extrinsic electron energy levels that is optimized for solar spectrum conversion to electricity.

Seg-matter is a segton-based metamaterial, i.e., the light-to-electricity conversion material constituted of homogeneously, in principle, distributed segtons in a superlattice immersed in a specific physical environment delimited by nanomembranes as described and protected by means of pending patents. Seg-matter allows taking advantage of the set of segton energy levels. Furthermore, the superlattice called seg-matter is an optimal arrangement of segtons in the form of one, two or multiple superposed layers. This nanoscale superlattice unit is a nanoscale grid of elemental units that are constituted and conditioned on the base of an elemental crystalline unit of the silicon lattice enclosing a structural point defect called divacancy. Segtons are advantageously coupled to their physically conditioned surrounding and are well astutely placed within the converter for absorption of the incident light.

Seg-matter nanolayer is the delimited semiconductor space occupied by the uniformly transformed silicon material (metamaterial) that wraps an amorphized inclusion in the crystalline medium.

Nanomembrane is the semiconductor heterointerface or boarding nanolayer (vertical, horizontal, parallel to the surface, more or less spherical or not), at which modifications of the band model, doping type, conduction mode and so on occur. For example, the interface between seg-matter and crystalline silicon is characterized by modification of the electron transport mode.

Giant photovonversion (GPC) is the photoconversion enhanced by a low-energy secondary generation for allowing optimal exploitation of the energy of the solar spectrum.

a-Si: amorphized silicon

<a-Si>: amorphized phase with a physical modification c-Si: crystalline silicon <c-Si>: crystalline phase with a physical modification <c-Si>/a-Si/<c-Si>: buried nanoscale Si three-layered system Si-nc: superficial nanoscale Si-layered system Divacancy: structural point defect in a semiconductor forming a specific structural unit BSF: back surface field BSF interface: LH type junction resulting from the abrupt or gradual modification of the density of doping impurity.

Amorphized nanograins: amorphized aggregates or nanogroups of locally transformed crystalline matter, preferentially of silicon, which have been included within the crystalline medium by any appropriate method.

Inserted nanostructures: amorphized nanograins coated with a nanolayer of the seg-matter, where the metamaterial is able to furnish numerous secondary electrons from the collisions of hot electrons due to their optimal distribution within the converter, preferentially, within the emitter.

PV conversion: photovoltaic conversion into electricity

PL: photoluminescence

PC: photocurrent

ARC: Anti-Reflection Coating

Multi-layer architecture: design developed around coupled stages; one stage concerns the complex light management, the second one the specific light-to-electricity conversion. Each stage may contain several different layers to effect its specific tasks.

Coupled stages: set the same device components that work independently on specific tasks but with interactions between them.

Complex light management: several operations on the incident light allowing its transformation by harvesting, splitting, controlled wavelength transformation, light-to-light conversion, guidance, concentration and focalization Smart treatment: a light-to-electricity conversion when a unique all or nothing photon-electron interaction is replaced by an energetic photon absorption and several lower energy electron-electron interactions producing the carrier multiplication.

Light-to-electricity conversion: transformation of light energy into electrical energy.

Innate quantum rigidity: there are two aspects, on the one hand, the threshold of the semiconductor band gap that limits the minimal photon energy for absorption, and on the other hand, the principle of one absorbed photon equals one generated electron.

Low-energy free-carrier generation and multiplication: for secondary electron generation at an optimal energy in silicon of about 0.3 eV, there are two generation events possible, i) direct, when the absorbed photon generates a hot electron that in turn generates secondary electrons and ii) indirect, when the radiation energy is absorbed by free-carriers and transmitted onto additional secondary electrons due to generating collisions with segtons.

Modulated electron transport: electron transport accelerated by an electric field near secondary generating centers due to: i) a built-in electric field and ii) geometrical arrangements within the semiconductor (local deviations, adjustments, alterations).

Smart free-carrier collection: collection of free-carriers exploiting local specificity of electron movement, transport mode alteration, and geometrical arrangements.

Multiplication order: maximal number of secondary electrons that can be generated by a given photon energy.

IR: infrared radiation that cannot be converted by the semiconductor because of its band gap.

UV: ultraviolet radiation constituted of energetic photons generating exclusively one electron-hole pair of hot carriers that is dominantly or totally (when surface recombination appears) transformed to heat.

3. FIELD OF THE INVENTION

The field of this invention is preferentially silicon light-to-electricity converters to produce electricity from the solar spectrum.

The innovation increases the performance of previously developed conventional converters by adding specific and efficient subsystems to the performance and actually made-up conventional converters perceived as the host systems.

4. STATE OF THE ART

The state of the art is illustrated by the two previous patents WO 2012/131496 and WO 2010/0896624 in which KUZNICKI Zbigniew and MEYRUEIS Patrick are named as inventors.

The limiting thermodynamic efficiency of unconcentrated solar irradiance into electrical energy in semiconductor devices is low (32%) because of semiconductor transparency in the IR and only partial utilization of photon energy in the blue-UV. This efficiency is calculated assuming detailed balance, a single threshold absorber, and thermal equilibrium between electrons and phonons. When the unused kinetic energy of electrons is converted into free carriers by low-energy (about 0.3 eV) secondary generation, the efficiency at one-sun intensity increases to more than 60%. This requires bypassing the usual assumption that one photon produces one electron-hole pair. The assumption does not apply when there is generation of additional electrons in a process involving a shallow extrinsic energy level and the conduction band.

The photovoltaic effect in today's devices is based on single-junction or multi-junction planar semiconductor devices. This simple architecture uses natural materials that are sometimes slightly modified. Progress in PV conversion efficiency requires optoelectronic breakthroughs. Completing one-step PV conversion by adding new low-energy mechanisms to one-step PV conversion is one of the important challenges of modern photovoltaics.

To increase the practical photoconversion efficiency of under 20% of single junction Si devices the following modifications have been applied:

i) gradient structures for controlled energy flows,
ii) interfaces and multilayers for unidirectional energy transfer,
iii) directional energy transfer in bi- and multilayers,
iv) giant photoconversion: quantum efficiency >100% due to ultrahigh efficiency of low-energy carrier multiplication cycle (experimental quantum efficiency around 130% for certain photon energies have been measured).

5. NOVELTY AND REQUIREMENTS

The novelty of the present light-to-electricity converter is that it permits an adapted architecture to benefit from new effects related to secondary carrier generation and multiplication as well as built-in nanomembrane systems and the carrier collection associated with them. The result is a giant photoconversion. The success of the invention depends on well-defined manufacturing methods.

The innovation combines the performance of conventional converters industrialized previously with the performance of specific subsystems inserted within the host device. The solution is based on an appropriate insertion within the crystalline host material of suitable subsystems taking the form of amorphous-like grains that are wrapped by a multilayer nanoscale system containing an active nanolayer of the seg-matter.

To avoid undesirable effects, the subsystems are effectively screened from surrounding material by a nanomembrane system that allows, for example, unidirectional flows of electric charges and an effective separation from recombination centers. The nanomembranes can also delimit specific parts of the emitter distinguishing each from other by the density or profile of their impurity doping like the LH (Low-High) junctions.

The system of modular amorphized grains is well-adapted to conventional single crystal Si converters. The preferential place for such transformations is the converter emitter that can be relatively easily optimized to enhance the performance of the overall device. New device nanocomponents of segtons, seg-matter, and amorphized grains work in synergy with the crystalline bulk of the host silicon or silicon-based material due to the active nanomembrane systems.

Such an arrangement allows succeeding stages of complementary more or less imbricated effects acting on three distinguishable and well-controlled levels:

Generation—segton,
Extraction/regeneration—seg-matter,
Collection—whole device.

Because solar light penetration inside the converter is nonlinear, the resulting additional secondary low-energy generation appears within the emitter depth with different intensity. So the corresponding active space of the converter has to be correctly structured from the viewpoint of segtons and seg-matter while simultaneously considering the indispensable electron transport.

A differentiation and optimization of the converter architecture is possible by taking into account spectral components of the solar radiation. Well-designed amorphized systems expose optimally their segtons and seg-matter to the nonlinear absorption of the penetrating light granting at the same time unperturbed carrier collection. A good arrangement of the converter space allows an optimal interaction between photons and seg-matter through hot electrons. Two main types of buried substructures are possible. For UV with shallow light penetration, thus a thin active emitter, the main design can be based on horizontal boards in a strip arrangement. For visible light with deeper penetration, and a thicker active emitter, the main design can based on vertical boards in a strip arrangement. An effective optimization adapts converter to different spectral ranges in order to improve its efficiency.

The manufacture method of grafted grain-like systems within the converter emitter exploits simultaneously: i) a differentiation of the emitter doping when amorphized grains are spread within the more heavily doped zone(s) placed at suitable depths, ii) the lateral shaping of buried grains due to implantation masks or suitable focusing of the incident scanning ion (electron) beam and iii) their vertical shaping due to a variable implantation energy (e.g., multi-energy implantation with specific and adequate thermal treatments) of the amorphizing ion beam.

The main fabrication method allows the non-perturbing insertion of amorphized grains within the crystalline material of the conventionally designed device by using well-known fabrication technologies. This is realized by a focalized energy beam of ions or electrons transforming locally a crystalline order that is finally fixed during an adequate thermal treatment.

6. THEORETICAL BACKGROUND

The invention concerns simultaneously physical effects, materials, and fabrication processing to significantly increase the efficiency of the light-to-electricity conversion.

The one photon-one electron principle no longer applies when there is generation of additional electrons in a process involving a shallow extrinsic energy level and the conduction band. Here we show that a complementary converter will cool hot electrons (generated by energetic photons) via a specific silicon metamaterial membrane system buried within the emitter at the c-Si/a-Si interface.

From the photoconversion viewpoint there are three modes of photon interaction with matter: transmission, conversion into electron flux (when the photon energy is close to the band gap) and conversion into both electron and phonon fluxes (when the photon energy is clearly above the band gap). Energetic photons produce two fluxes: electron flux→collectable current and phonon flux→energy lost heat. For photon energies that results in carrier multiplication, where the multiplication cycle is characterized by the ratio of additional photon energy to specific segton energy $E_\delta$ (the mean value of $E_\delta$ is 0.274 eV). A multistage process allows conversion of energetic photons into a electron population. The unused kinetic energy of photogenerated hot carriers, reaching a buried substructure(s) with a nanoscale Si-layered system, is transferred to near-equilibrium electrons collectable in the external circuit.

The multistage conversion cycle starts with the primary generation (photon absorption), then continues with secondary generations by multiple collisions of hot electrons with segtons (due to the specific low-energy mechanism). To ensure the permanent electric charge state of the segton a specific electron transport mechanism within seg-matter through its boarding nanomembranes (interfaces) is absolutely necessary. This charge replenishment depends on the extremely short time constants of the segton dynamics (recharging).

The multiplication cycle depends on the dynamics of the involved carrier population that has to be taken into account situating of the sag-matter within the converter, preferentially within the emitter. So one of the manageable ways is a superposition of desired effects within a limited and suitably localized volume, subvolumes, part(s) of the emitter to assume optimal conditions for the full and efficient cycle of the giant photoconversion.

The modulation of the local material uses simultaneously several physical interactions, such as variation of the matter structure, heavy impurity doping, transition zones of semiconductor interfaces, local stress fields, local electric fields, local electron transport, effective electric screening and well-defined functionality of usefully arranged active components. The conceived material modulation preserves conventional-like behavior of the converter due to, for example, adapted ratios of geometrical factors, useful defect screening, unperturbed free-electron extraction as well as specific electron transport mechanisms.

Using the quantum dots analogy, one can say that the silicon bandgap is controlled by confinement of carriers in artificial semiconductor nanoobjects, i.e., segtons, which behave like individual atoms or molecules. If they are close enough to allow large collision probability, atomic-like electron energy levels appears in the band model of a bulk semiconductor. This gives rise to a new version of the semiconductor material with electrical and optical properties that are tuned by adjusting the seg-matter size, segton density and seg-matter disposition within the converter. A membrane separates carriers of the same electric charge (electrons) but of different kinetic energy, i.e., hot electrons from near equilibrium electrons. Active substructure(s) is(are) embedded within a part(s) of the emitter that distinguishes by its higher doping density from its(their) neighborhood.

This innovation presents a practical realization of the theoretically evoked prediction for the bright future of the highly efficient light-to-electricity conversion due to "semiconductor nanocrystals embedded in semiconductor matrix". Nanostructured transformations of semiconductors, preferentially of Si, lead to optimized nanocrystal-like nanoobjects, called segtons and corresponding metamaterial, called seg-matter. This is an answer how to operate in practice.

A part of the enhanced functionality is assumed by active nanomembranes that separate appropriately inserted subgrains from their surroundings. Such subsystems occupy a relatively small part of the converter volume, being grouped essentially in the emitter, rather in a part of the emitter. In this way nanomembranes allow avoidance of undesirable effects resulting from the insertion of a foreign body of active grains. In other words, the inserted subsystems are practically invisible by the host system except for an unperturbed addition of the metamaterial performances to the performance of the conventional components of the converter.

Due to original solutions that has been never used before and that relies on sparsely grafted grains, the designer has much liberty in the converter design and its optimization.

The built-in nanomembrane system or subsystems allow a transformation of a conventional semiconductor bulk, in particular and preferentially silicon, by addition of nanostructured components. Grain-like inclusions bring locally physical conditions necessary to modulate deeply enough the host matter with respect to number, shape, position, size and depth of required generation centers and the corresponding electron transport around them.

Modular architecture allows an optimal arrangement of the converter components interacting with hot electrons by an adjusted distribution of the seg-matter. The efficiency enhancement of the light-to-electricity conversion incorporates also an excellent collection of all electrons (primary and secondary) generated within the converter.

7. PROBLEMS SOLVED BY THE INVENTION

The main objective of the invention is to overcome the fundamental maladjustment of any semiconductor converter to the solar spectrum leading unavoidably to an only very partial efficient conversion of the light energy into electricity. The poor conversion efficiency is a result of inappropriate methods and instruments.

Today light-to-electricity conversion is dominated by a one and only one step process, the all or nothing (hard) interaction. Another aspect of the conversion lies in the spectral distribution of the solar light and the quantum mechanical rigidity of existing semiconductor converters. New conversion mechanisms modify the one step absorption-generation phenomenon into a multistage cycle of primary and secondary generations transforming the process into soft interactions. This now becomes possible due to a specific arrangement of new devices with several active components involved in different stages of the conversion cycle.

An optimal multistage photoconversion in all-silicon light-to-electricity converters becomes possible by interactions at three complementary levels: segton, seg-matter and, ultimately, the whole device. Modular amorphized-like grains having useful shapes, dimensions and distribution are disposed in an optimal arrangement within the crystalline matter of the emitter with modulated doping density.

Despite constrains there is a certain freedom for the device design and architecture that can be developed from the building blocks. Different variants allow an optimal adaptation with the respect to the solar spectrum and its specific sub-ranges as well as with the industrial requirements of fabrication.

8. BENEFITS OF THE INVENTION

The innovation deals primarily with the very good candidate material silicon (abundant, technologically mature and environmentally friendly) astutely transformed on the nanoscale. The light-to-electricity converters to be described can be preferentially built from it. It is particularly interesting that the "old" silicon can be provided with an additional new set of suitable energy levels made available by active substructures containing segtons.

New devices can be manufactured using machines common in the photovoltaic, microelectronic and optoelectronic. In this way the relative increase cost of manufacture remains reasonable in view of the conversion improvement.

9. SUMMARY OF THE INNOVATION AND THE FUNCTIONS

This innovation relates to a specific architecture of a light-to-electricity converter and the method to obtain a device for the practical exploitation of a giant photoconversion that is possible due to an inserted nanomembrane system. Components such as segtons, seg-matter and amorphizations co-work suitably with the crystalline bulk of the host silicon or silicon based semiconductors.

Electron multiplication by collisional and collisional-like generations as a function of excitation wavelength permits a new approach to light-to-electricity conversion by the inset of new multistage mechanisms avoid energy losses by thermalization of hot electrons.

The giant photoconversion results from succeeding phases of complementary more or less imbricated effects that can be distinguished on three well-controlled levels: segton, seg-matter and final device. The addition of a silicon metamaterial in the emitter leads to a multiplying tandem-like cell when a complementary converter is included in a conventional device.

Internal nanomembranes separate: i) carriers of different signs (electrons—holes), ii) same carriers of different densities and iii) same carries of different energies (electrons). They complete the system based on hot electrons with low-energy (extrinsic) centers of the metamaterial by maximizing the scattering cross section.

These amorphized grains are shaped and suitably spread within the emitter by: i) the masking or focalization of the implantation ion beam (horizontal shaping) and ii) multi-energy implantation processing (vertical shaping). An optimization of the arrangement of active substructures within the crystalline matter of the emitter becomes then possible. The adequate thermal treatment leads to a wrapping of inserted grains by a seg-matter nanolayer.

The core of the innovation is founded on an optimal interaction between photons and seg-matter via hot electrons. On the one hand, material engineering using structural defects and free-carrier/matrix interactions produces important physical transformations of usual c-Si leading to Si-metamaterials. On the other hand, the superposition of more or less known conversion mechanisms puts single photon absorption at the head of a conversion cycle, i.e. one obtains multistage processing. As an analogy we can cite the cycle of semiconductor laser pumping followed by light emission needing several energy levels.

10. BRIEF DESCRIPTION OF THE DRAWINGS

The appended figures are include to help better understand the present invention.

Symbols used:
- $NM_{phase}$ is the nanomembrane resulting from the a-Si/c-Si (<c-Si>) heterointerface appearing between different phases of the same semiconductor material, e.g., silicon,
- $NM_{field}$ is the nanomembrane at the c-Si/<c-Si> heterointerface at the limit of the defect field where the segton energy levels exist on the one side and does not exist on the other side
- $E_{be}$ is the effective potential barrier for electrons penetrating into amorphized material
- $E_{bh}$ is the effective potential barrier for holes penetrating into amorphized material
- $E_{go}$ is the band gap on the crystalline side
- $E_{ga}$ is the band gap on the amorphized side
- $E_F$ is the Fermi level of an n-type doped silicon
- CB and VB are, respectively, conduction and valence band.

FIG. 8 is a cross-sectional image by transmission electron microscopy from a sample that is cut vertically through the emitter after the formation of nanomembranes. This example illustrates the transformation of transition zones between two different phases of the same material (crystalline and amorphized) from FIG. 7, after a specific cycle of the thermal treatment, into a well unwavering nanomembrane system (see FIG. 3). The figure shows two distinguished parts; the left one represents one transition zone and the right one represents another transition zone between two Si phases, crystalline and amorphized, appearing at the ends of the same buried amorphized layer. The nanomembranes between a-Si and <c-Si>, are sharp (they are indicated by down-oriented arrows). The nanomembranes between <c-Si> and c-Si, are gradual (they are arbitrary indicated by up-oriented arrows). The interface between seg-matter and crystalline silicon (<c-Si>/c-Si) characterizes mainly by the modification of the electron transport mode.

11. DETAILED DESCRIPTION OF THE INVENTION

To increase light-to-electricity conversion in silicon, it must undergo a complex transformation which leads to the creation of elementary units called segtons from normally undesired, randomly and sparsely distributed structural defects. After formation these elementary units are distributed as a superlattice of a metamaterial called seg-matter. The most important variables are the nature, density, number and local concentration of point defects (divacancies) occupying the right positions in the converter space.

Figure 1:
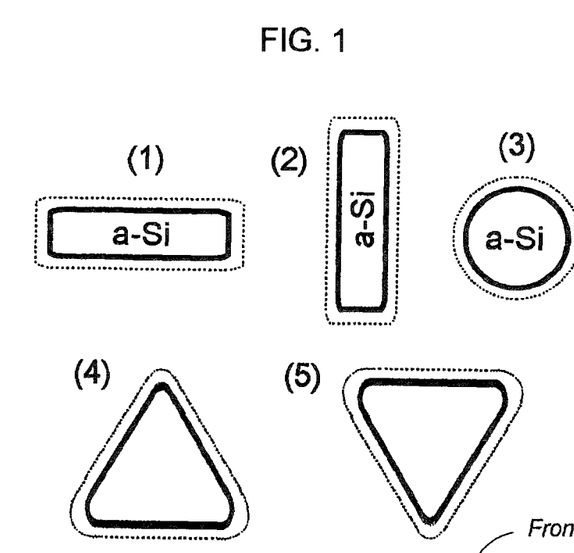
FIG. 1 is a schematic drawing of example shapes of amorphized grains inserted within a crystalline material: 1) horizontal nano board, 2) vertical nano board, 3) nanosphere, 4) trapezoidal with large front face and 5) trapezoidal with narrow front face. Other shapes are possible such as ovoid T or D or C profiles. The amorphized nanograins (with the geometrical size of tens of nm) shown and labeled as a-Si are surrounded by a coating of seg-matter, i.e. a metamaterial as described in pending applications by the same inventors. The size of amorphized grains is of the order of tens nanometers. Drawings are not to scale.
Figure 2A:
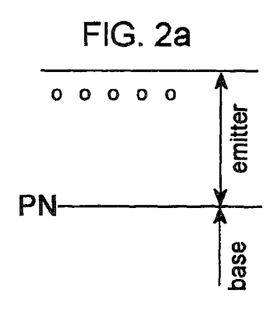
FIG. 2 is a sectional view of the base-emitter region which shows examples of buried nanosystems containing nanostructures of coated nanograins disposed in different arrangements (a, b, c, d, e, f). These figures represent a few of the numerous arrangements of embedded nanostructures possible with the present invention. These nanostructures result from the above-mentioned method. Amorphized grains are preferentially formed in the region of the emitter with an amorphizing ion beam and then processed with successives thermal cycles. Drawings are not to scale.
Figure 2B:
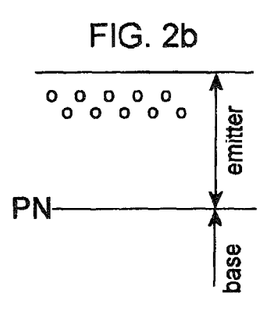
Figure 2C:
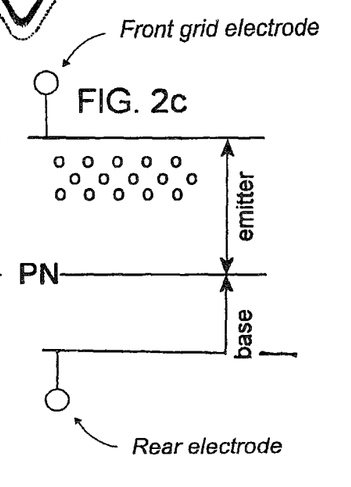
Figure 2D:
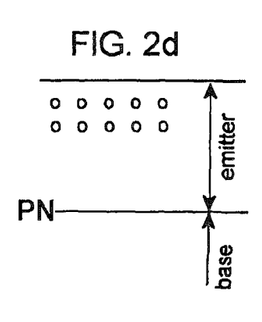
Figure 2E:
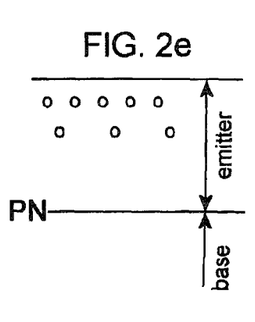
Figure 2F:
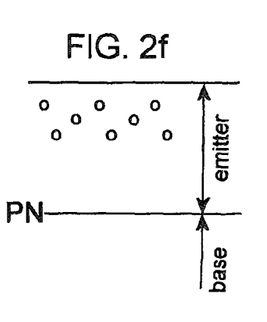

Giant photoconversion can be exploit within one-level or multi-level substructures of a simple/uniform or multiform arrangements including objects of different shapes and dimensions (spherical, horizontal or vertical blocs, boards, pillars) that can be adjusted to a given spectral subrange (by depth, shape, superposition, see FIG. 1). Such a complex structure becomes available through local modulations of the material at the nanoscale, which are made possible by a precise deposition and/or focalization of the incident energy beam when fabricating the device.

By the analogy, the arrangement of amorphized grains (seeming as nanocrystal-like object) within the crystalline host material (c-Si) can be compared with the location of silicon nanocrystals within the dielectric. In both cases a set of electron energy levels is tuned to an efficient interaction with the solar spectrum (see FIG. 2).

The system of distributed amorphized "grains" has to contribute:
- optimized capture cross section of discharged segtons with regard to their set of energy levels and the solar spectrum
- optimized distribution of energy level sets at nanomembranes with the respect of the impurity band, segton band and conduction band
- usefully directed built-in electric fields allowing a unipolar/unidirectional conduction from the amorphized grain into its surrounding
- unipolar electron transport due to localized injection and extraction across nanomembranes—local mode of electron transport inside and outside of seg-matter nanolayer
- extremely fast electron injection into seg-matter due to a wave nature of electron interactions between impurity levels and segton sites
- coexistence of several electron subpopulations differentiated by their mean energy distribution (occupation of energy levels) and spatial distribution within the converter
- suitable distribution of doping impurity and segton energy levels allowing tunneling transitions from the impurity levels to segton levels
- selective attraction or repulsion (from the electron injection and from the electron extraction viewpoints) of electrons on the nanoscale at limits of the seg-matter nanolayer
- selective mechanisms:
  - same spatial position—different energies
  - same energy—different spatial positions
- suitable distribution of energy levels in the impurity band (electron sieving, screening)—free segton level at $E_c$—0.41 eV and impurity level at $E_c$—0.07 eV—down spread of impurity levels in the energy band
- coexistence of different electron subpopulations inside and outside the seg-matter containment of electron subpopulations in the seg-matter:
  i) hot/warm—corpuscular nature—multiplication—intermediate rapidity effects, ii) equilibrium—corpuscular nature—low rapidity effects—extraction, iii) impurity/segton—wave nature—high rapidity effects—segton regeneration domination of photon capture events outside the seg-matter (electron events are negligible) and domination of electron events inside the seg-matter (photon events are negligible).

Figure 7:
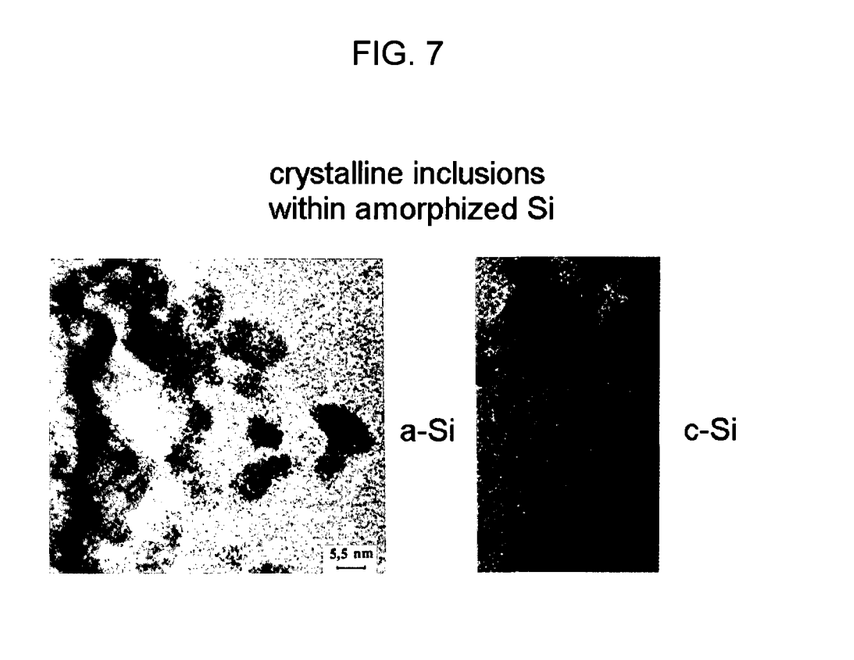
FIG. 7 is a cross-sectional image by transmission electron microscopy from a sample that is cut vertically through the emitter before the thermal treatment cycle. The figure shows two distinguished parts; the left one represents one transition zone and the right one represents another transition zone between two Si phases, crystalline and amorphized, appearing at the ends of the same buried amorphized layer just after its ion beam amorphization. Well visible crystalline inclusions within the amorphized Si confirm that in this stage the system is strongly disordered and that in this stage of the processing the nanomembrane system doesn't exist.

In the first step of fabrication, the amorphization produces irregular and jagged amorphized inclusions taking the form of grains with different shapes such as nano boards, nano pillars, nano balls buried within the crystalline material. In the first step, the nanograins are irregular with rough/rugged a-Si/c-Si heterointerfaces and relatively large a-Si/c-Si transition zones with small a-Si inclusions in c-Si and c-Si inclusions in a-Si (see FIG. 7).

Figure 3A:
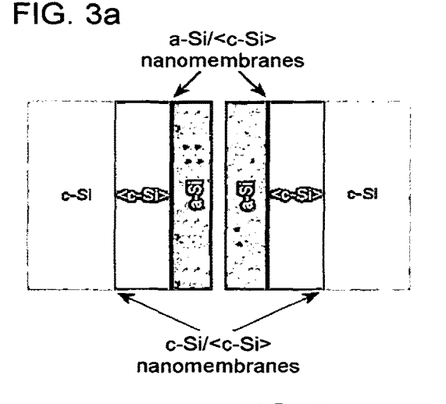
FIG. 3 is a sectional view through a tiny part of a material with a nanomembrane system wrapped around amorphized grain. Nanomembranes are shown as solid black vertical lines: a) two types of nanomembranes appear: one between a-Si and <c-Si> and another between <c-Si> and c-Si, b) transition zone between two limits of a planar nannomembrane, c) transition zone between two limits of a curved nannomembrane. The interface between seg-matter and crystalline silicon (<c-Si>/c-Si) is characterized by modification of the electron transport mode.
Figure 3B:
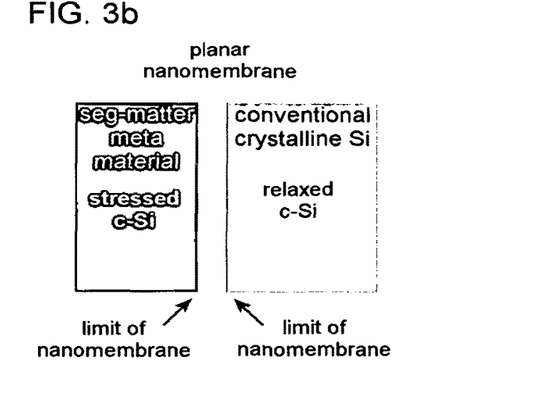
Figure 3C:
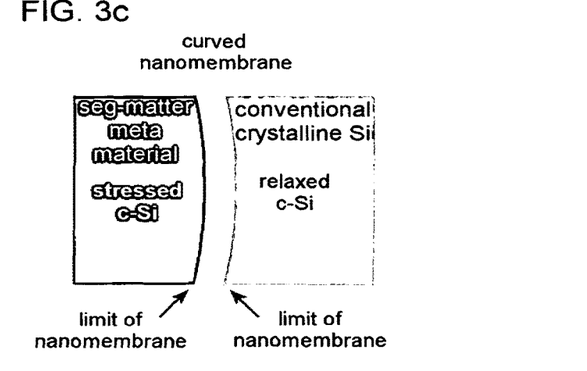
Figure 4:
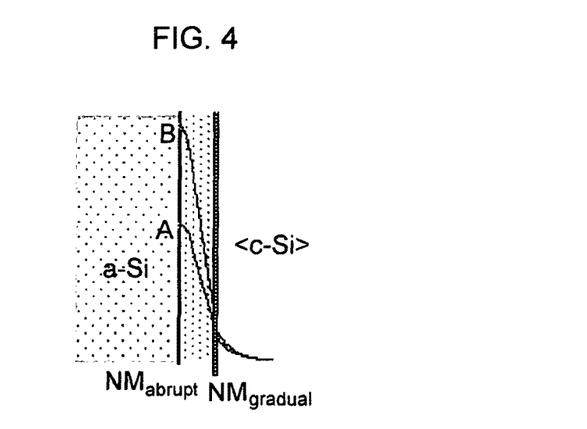
FIG. 4 is a schematic representation of a nanomembrane system resulting from a physical field distribution within a semiconductor. Two main transition features from one component to another precisely localized, abrupt transition ($NM_{abrupt}$) and ii) gradual, arbitrarily determined transition limit ($NM_{gradual}$).
Figure 5:
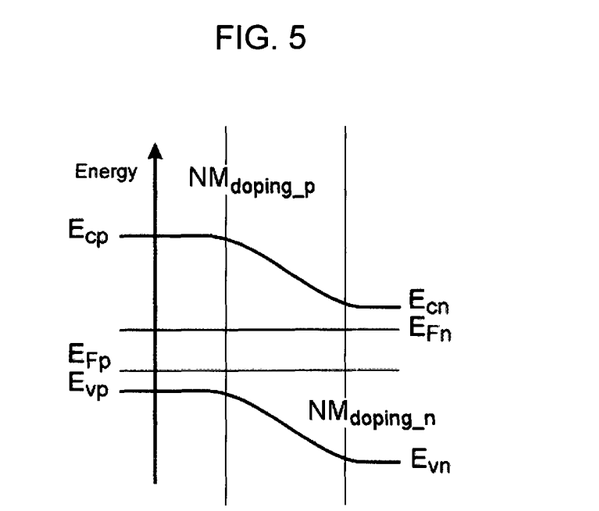
FIG. 5 is a schematic representation which illustrates the relation between the effective potential barriers for electrons and holes for penetrating into the amorphized material before and behind the nanomembranes $NM_{phase}$ and $NM_{field}$.
Figure 6:
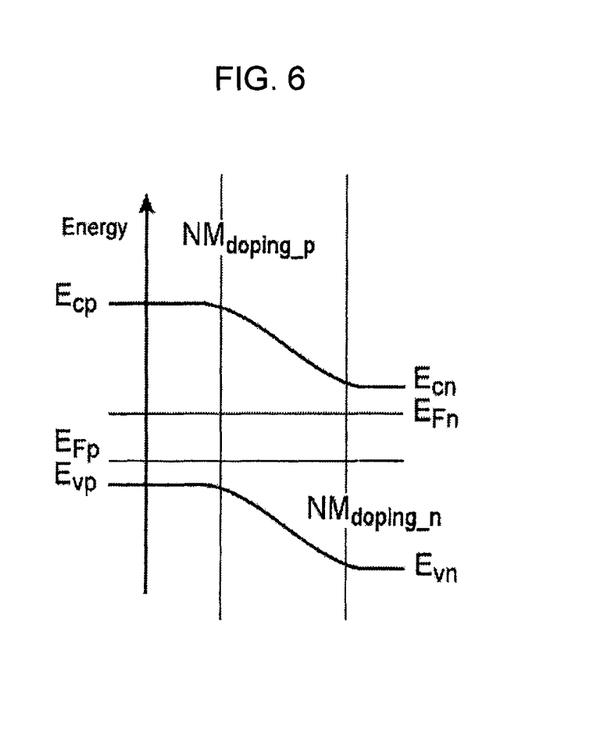
FIG. 6 is a schematic graph which illustrates an example of two nanomembranes at limits of the gradual PN junction with gradual, arbitrarily determined transition limits.
- $NM_{doping\_p}$ is the nanomembrane resulting from the gradual PN transition zone on the p-type side; c-Si(p)/c-Si(n) interface appearing between different doping density levels in the same semiconductor material, e.g., silicon,
- $NM_{doping\_n}$ is the nanomembrane resulting from the gradual PN transition zone on the n-type side; c-Si(n)/c-Si(p) interface appearing between different doping density levels in the same semiconductor material, e.g., silicon,
- $E_c$, $E_v$ and $E_F$ are, respectively, bottom of conduction band, top of valence band and Fermi levels on the p-side (additional subscript p) and on the n-side.
Figure 8:
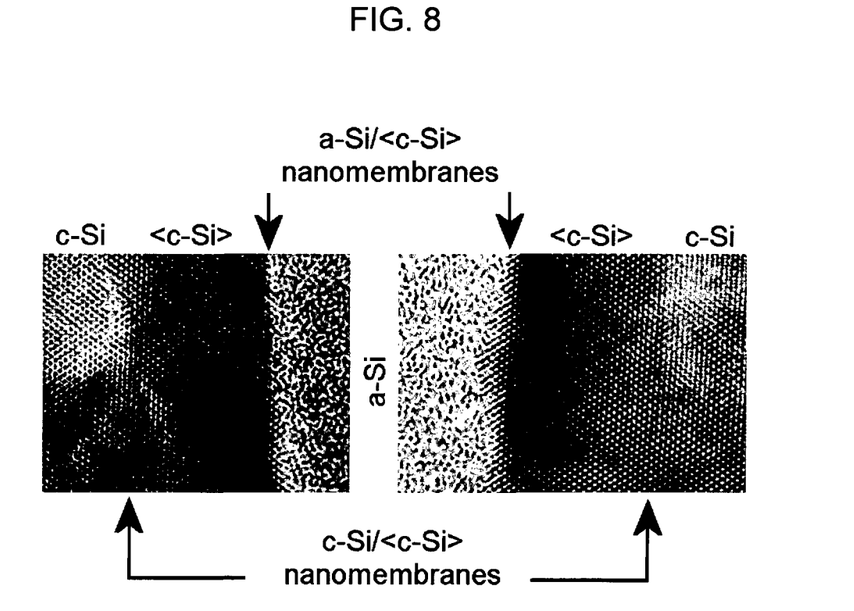

The subsequent annealing cycle, preferentially at about 500-550° C. takes the form of a solid state epitaxy and leads to a clear separation of the crystalline and amorphized silicon phases as well as to the establishment of sharp, planar, spherical or more or less curved, a-Si/c-Si heterointerfaces (see images of FIG. 8 and scheme of FIG. 3). In this stage the device contains well-disposed and ordered subsystems spread within the host material of the emitter.

It is very important, that the same annealing cycle conditions nanolayers of the seg-matter with an ordered matrix of segtons. The 3-10 nm thick nanolayer of seg-matter, a silicon based metamaterial, is uniform and wraps smoothly, without faults and inequalities, the amorphized grains within a heavily n-type doped silicon (phosphorous doping, Si:P).

The numerous semiconductor interfaces created during the manufacturing process can be associated with nanomembranes that are specific subsystems assuming different functionalities. This can lead, for example, to the change of doping concentrations or to the change of the main mechanism of the electron transport by crossing from one side to another. The local mode of electron transport can be altered from a bipolar to a unipolar nature. The conduction inside a semiconductor nanolayer delimited by nanomembranes can be assumed exclusively by electrons. In this situation, only energy levels and energy bands concerning electron-related mechanisms are involved while holes are totally excluded. The nanomembrane allows electron transitions from the one set to another set of different energy levels that are separated spatially.

A semiconductor nanomembrane can result: i) from the superposition of two different phases of the same material, ii) from the difference of the impurity doping (type, density), iii) from the superposition of two different materials (heterostructure) and iv) from the insertion of a specific nanolayer. Another type of semiconductor nanomembrane results from the local distribution of physical effects. For example, at a semiconductor interface (heterointerface) built-in physical fields, mechanical, electric, are usually present.

Modification of the conduction mode at the nanomembrane affects also the local recombination of minority carriers. A well-conditioned nanomembrane assumes the electrical screening of the recombination centers related with the inserted defect zone of the amorphization.

By analogy with the conduction of a PN junction, current continuity is assumed at the nanomembrane by the local recombination of carriers arriving from different regions and not by the flow/transition on the same energy levels in the same energy bands. In this way the switch between unipolar and bipolar electron transport appears.

The thickness of the metamaterial nanolayer (<c-Si> nanolayer) is determined by the local built-in strain field resulting from dilatation induced by the recrystallization cycle during the solid phase epitaxy. Experiments (X-ray, LED, electron microscopy) show that on the crystalline side (well visualized by available techniques) this layer is of the order of 3-10 nm. Example of a nanomembrane system is shown in FIG. 3. The main features:

- the c-Si/<c-Si> nanomembrane separates the crystalline Si phases containing and not containing segtons; each side contains a different set of electron energy levels and a different mode of conduction that is bipolar in c-Si (conduction and valance bands) and unipolar in <c-Si> (impurity and conduction bands)
- the c-Si/<c-Si> nanomembrane is plunged in the built-in electric field induced by the <c-Si>/a-Si interface (resulting from the valance band offset; hole accumulation/desertion, LH-like junction)
- the <c-Si>/a-Si nanomembrane separates the crystalline <c-Si> and amorphized (a-Si) material; each side containing a different set of electron energy levels and a different mode of conduction that is bipolar in a-Si (conduction and valance bands with their tails) and unipolar in <c-Si> (impurity and conduction bands).

12. MANUFACTURING PROCESS

The manufacture uses a superposition of epitaxial layers and other technological processes such as laser, electron and ion beams; thermal annealing cycles, more about the epitaxy and related processes.

Exploitation requires specific conditions and optimization; the basic converter design and components can be optimized for spectral subranges, mainly from the viewpoint of conversion efficiency, fabrication costs, direct-diffused light beams, small-large active areas.

The preferred architecture is based on reservoirs of divacancies that consists of amorphized grains inserted within the emitter of the light-to-electricity converter. These amorphized divacancy correspond to the nanolayer wrapping each grain after suitable processing. The seg-matter nanolayer with grafted segtons is immersed in various physical fields must strongly present at the a-Si/c-Si heterointerface.

The amorphized grains can take different forms such as nanoboards, nanopillars and nanospheres or other shapes. The reservoirs can form one-level or multi-level substructures of a simple or multiform geometry including objects of different shapes and dimensions: spherical, horizontal or vertical blocs, boards, pillars that can be adjusted to a given spectral subrange (by depth, form, superposition, . . . ). By analogy, the arrangement of amorphized grains (large nanocrystal-like object) within the host material (c-Si) can be compared with the location of silicon nanocrystals within the dielectric. In both cases a set of electron energy levels is tuned to efficient interaction with the solar spectrum.

Seg-matter has to be placed within the emitter preferentially near to the front face of the converter in close connection with converted light wavelength. A method of nanoscale transformation being able to fulfill several required conditions is based on a local amorphization of a previously crystalline semiconductor using an ion beam. This processing allows a good localization of the reservoir for the point defects (amorphized phase) in the device space and can lead to self-organization in an ordered superlattice due to the built-in strain field induced by dilatation forces at the c-Si/a-Si interface.

There are at least two possible methods of implementation:
- two-step processing: previous n-type doping (P) next followed by an ion implantation up to local/buried amorphization (P, Si),
- single-ion implantation up to local/buried amorphization using exclusively doping ions (P).

Both methods lead to heavily doped material and allow as a consequence a unipolar conduction involving simultaneously the impurity and the conduction bands. The choice depends on a fine adjustment to the converted spectrum.

The amorphization can be realized through implantation masks using a more or less continuous variation of the implantation energy and dose. Good control of the implantation conditions, ion current density and corresponding target temperatures, allow a large useful material modulation. The cycle has to be completed by a suitable cycle of thermal treatment.

The first, amorphization step produces buried amorphous grains (nano boards, nano pillars, nano balls) with rough/rugged a-Si/c-Si heterointerfaces and small a-Si inclusions in c-Si and c-Si inclusions in a-Si. The subsequent annealing cycle, preferentially at about 500-550° C., takes the form of a solid state epitaxy and leads to a clean separation of both silicon phases (crystalline and amorphized) as well as to sharp planar a-Si/c-Si heterointerfaces. The same annealing cycle leads to the creation of more or less planar nanolayers that smoothly wrap each amorphized grain. These nanolayers of 3-10 nm thick are uniform, without any faults or inequalities. They contain numerous and ordered segtons forming together the seg-matter which is a silicon based metamaterial. To become technically useful the divacancies have to contain permanently four captured electrons (one of them weakly bonded). This is possible in a heavily n-type doped material, e.g., provided with a high phosphorous doping (Si:P).

One of the best techniques able to fulfill the numerous requirements of segton shaping occurs the transition between silicon phases around an amorphized-crystalline heterointerface, i.e., a controlled recrystallization of the previously amorphized crystalline material. The amorphized phase contains displaced atoms with a "memory" of their previous position in the crystalline network.

By a suitable recrystallization in which the energy necessary for the transformation is relatively low, part of the displaced atoms stay at their new sites while the phase becomes crystalline with numerous point defects. The recrystallized material has a dominant crystalline behavior but contains numerous displaced atoms distributed rather uniformly. The controlled recrystallization has to respect several conditions concerning the recrystallization (solid epitaxy) rate, temperature, delay after amorphization to conserve numerous displaced atoms in their new positions and to avoid additional unwanted structural damages resulting, for example, from too violent atomic movements.

Such a material modulation has to satisfy the optimized conditions of the final converter architecture, i.e., the shape of all inserted (buried) subsystems from the absorption and conduction viewpoints. This processing produces a good localization of the transformed material within the converter.

This is the only processing able to satisfy all the above-mentioned requirements simultaneously, namely the ion implantation and a well-controlled, subsequent thermal treatment.

The a-Si/c-Si heterointerface gathers numerous divacancies (to a density of about $10^{20}$ cm$^{-3}$), which are trapped within the dilatation (tensile) strain field. This well-localized tensile field plays at least four roles: i) it reduces divacancy recombination, ii) it reduces divacancy mobility allowing trapping them in a well-defined volume, iii) allows divacancy conservation at unusually high temperatures (500-550° C.) during the device manufacture and iv) it puts the divacancy distribution into a self-ordered superlattice.

The same a-Si/c-Si heterointerface provides the seg-mater nanolayer in the well-directed built-in electric field (LH-like—resulting from the transition from the lightly to the heavily doped zone), which extracts just-liberated secondary electrons outside the seg-matter nanolayer.

The ion implantation and subsequent processing allows fulfillment of other requirements of the segtons as the permanent double negative charge state, the spatial disposition, the electron transport, etc. All these transformations lead to a metamaterial build from segtons. The segton double negative charge state allows a low-energy electron transition/release between the divacancy/segton energy level in the upper half of the indirect Si band gap and in the conduction band. The concentration of doping impurity (n-type semiconductor) has to be large enough to charge and recharge all the numerous divacances. The technically useful double negative charge state has to be instantaneously renewable just after an electron emission/extraction. All the above-mentioned requirements transform the divacancy (single physical object) into a segton (divacancy with its suitable environment, i.e., technical object) that furnishes suitable energy levels occupied by weakly bonded electrons.

In general, the fabrication/manufacture and conditioning of the light-to-electricity converter has to allow simultaneously:

An ion implantation to allow the creation of specific nanoobjects (type, electric charge state, density, location/position in geometrical space, . . . ) that result from a reorganization of atoms of the crystalline lattice (and/or of the amorphous/amorphized phase). The structural transformation leading to a new material phase results from an accumulation of point defects contained in a specific space (nanolayer); for example, the density and the internal energy of the new phase is lower than those of its crystalline counterpart that would classify it somewhere between crystalline and amorphized. What is more, this processing has to produce a correct localization of the transformed material from the converter architecture viewpoint.

A dense enough doping profile of the n-type and can be obtained in two ways, by the diffusion of doping ions or by a suitable doping ion implantation. The specific high density of the doping profile refers to the buried substructure and its near neighborhood.

There are other techniques that allow a good control of the doping profile and level in the emitter, such as different epitaxial deposition with different configurations of the growing layers.

Material modulation and structural transformations: To obtain a new phase from well-known "old" classical material useful for soft light-matter interactions, one can start, from its crystalline phase by a local deep transformation leading to a specific "modulation" of atomic sites in the crystalline lattice. Such an atomic scale processing results, for example, in shifting some of the atoms from their equilibrium sites in the crystal unit cell into metastable sites that are usually unoccupied. The new metastable atomic distribution has to furnish a large enough number of displaced atoms. The required processing has to allow a local energy deposition as does an irradiation by a more or less focalized ion beam. The operation is able to shift a large atomic population in a specific volume and assumes in this way produces a profound material modulation.

Material modulation leading to the creation of segtons: an ion irradiation allowing the required material modulation can be realized in several stages:

1) an initial n-type doping profile (e.g., phosphorous) by so-called low-temperature thermal diffusion at T<1000° C. in a homogeneously (lightly or moderately p-doped) wafer (e.g., pre-doped by boron),
2) preconditioning of the wafer surface after the diffusion process to allow a good control of the implanted volume,
3) 50-200 keV ion beam irradiation leading to a buried amorphization, possible in two ways, by a self Si implantation or by P implantation,
4) constitution of excellent c-Si/a-Si heterointerfaces by a thermal annealing cycle at 500° C.,
5) constitution of metamaterial nanolayers by a thermal annealing cycle at 350-450° C.,
6) activation of segtons
7) device final processing (A-R coating, electronic passivation, metallizations)

Transformations:
phase transformation (ion implantation): crystalline→amorphized→crystalline with locally concentrated point defects processed further into segtons
c-Si/a-Si interface (ion implantation): creation→smoothing→seg-matter
local homogenization of amorphized and crystalline phases (annealing cycle) by dissolution of inclusions nanomembranes delimiting seg-matter: a-Si/c-Si→a-Si/<c-Si>—energy barrier (a high offset in the valence band) and <c-Si>/a-Si—change of the electron transport mode
conditioning/processing of segtons (annealing cycle): activation of heavy doping

Basis of improved photoconversion. Summary.

| Object | Operation |
|---|---|
| converter | main goal of the nanostructuration: incorporation of new efficient conversion mechanisms into rather conventional Si converters - an efficient low-energy secondary generation |
| | introduction of appropriate structures into the device emitter (correct depth and fine structure) |
| | design of substructute(s) for a low-energy secondary generation - mapping, architecture, superposition |
| amorphizing ion implantation | appropriate distribution of amorphized nanoobjects with suitable initial sizes: grains/inclusions/insertions/substructures providing the converter with reservoirs of segtons and seg-matter |
| | appropriate processing - one or more beams, energies, doses, angle(s) of incidence, species, the order, interactions, conditions (for example, target temperature), shaping with respect to further processing (eventual superposition of successive treatments), previous and subsequent processing steps, specific conditions |
| structure | cycle(s) of thermal treatment has(ve): |
| | to shape the areas on both sides of the c-Si/a-Si heterointerface to order to retain their extreme mismatch just after the amorphization |
| | to dissolve or restructure inclusions of opposition phases (a-Si in c-Si and c-Si in a-Si) |
| | to release the crystalline <c-Si> phase stuffed with numerous point defects and to smooth the distribution of the crystalline <c-Si> phase that surrounds uniformly the amorphized objects |
| | to homogenize the distribution of segtons inside the crystalline <c-Si> phase (it can be denser near the a-Si/<c-Si> interface and less dense close to the <c-Si>/c-Si interface |
| | to smooth and stabilize c-Si/a-Si interfaces |
| | to align and stabilize the dilatation (tensile) strain (especially on the c-Si side) |
| n-type doping | previous or simultaneously with amorphization |
| | activation of the heavy n-type doping (better ionization rate with ion implantation) |
| charge state | permanent doubly negative charge state under light illumination |
| | extremely fast dynamics of segton recharging after a secondary generation |
| electron transport | free vertical transport through the emitter allowing an optimal carrier collection |
| | advantageous weighting between the transport mechanisms of conduction and impurity bands |
| characterization | optical: intermediate characterization (for example reflectivity) using calibrated reference samples or dedicated wafer areas (without implantation masks or with dedicated scanned paths) |
| | electronic: I(V) curves |

Example of the general process step-by-step

| # | Operation | Description |
|---|---|---|
| 1 | c-Si | crystalline silicon wafer |
| 2a | c-Si (p-type) | homogeneous - light or moderate - p-type doping |
| 2b | c-Si (p-type) | rear p-type doping creating a BSF |

-continued

| # | Operation | Description |
|---|---|---|
| 3 |  c-Si (n-type) / c-Si (p-type) | heavy nonlinear n-type doping by diffusion from a surface source; creation of an internal membrane as PN junction |
| 4 |  c-Si (n-type) / c-Si (p-type) | surface conditioning before implantation sequence |
| 5 |  a*-Si (n-type) / c-Si (p-type) | amorphizing ion beam implantation through a mask that creates a buried substructure (a*-Si) |
| 6 |  a**-Si (n-type) / c-Si (p-type) | solid-state epitaxy resulting from an annealing cycle (a**-Si) |
| 7 |  <c-Si> nano layers / c-Si (p-type) | segton conditioning within the seg-matter |
| 8 |  c-Si (p-type) | electronic passivation; metallization; light trapping |

The present invention is not limited to the embodiments described and represented herein but encompasses all variants, alternatives and changes that can be operated without departing from the scope and framework of the invention.

The invention claimed is:

1. An architectural system defined within an emitter space of a semiconductor light-to-electricity converter, comprising:
   a front electrode;
   a rear electrode;
   a base portion disposed adjacent to said rear electrode;
   an emitter, comprising crystalline silicon (c-Si), disposed adjacent to said front electrode and having a front face portion;
   a PN junction interposed between said base portion and said emitter; and
   at least one layer of amorphized silicon (a-Si) nanograins comprising a plurality of horizontally separated amorphized silicon (a-Si) nanograins disposed within an upper region of said emitter so as to be close to said front face portion of said emitter, each one of said plurality of horizontally separated amorphized silicon (a-Si) nanograins having a predetermined vertically elongated geometrical configuration such that a relatively small upper surface area is disposed toward said front face of said emitter while a relatively large body surface area of each one of said amorphized silicon (a-Si) nanograins is disposed within said emitter, and wherein each one of said plurality of horizontally separated amorphized silicon (a-Si) nanograins is enveloped within a coating of metamaterial such that when said light-to-electricity converter is exposed to incident light, only a small part of the incident light is absorbed within the amorphized matter comprising said plurality of amorphized silicon (a-Si) nanograins as a result of only said relatively small upper surface area being exposed to incoming photons, while hot electrons, generated by energetic photons entering said emitter and moving in all directions within said emitter, will massively collide with said plurality of horizontally separated, vertically elongated amorphized silicon (a-Si) nanograins so as to result in vastly multiplied secondary electron generation.

2. The architectural system as set forth in claim 1, wherein:
   said predetermined vertically elongated geometrical configuration of each one of said plurality of horizontally separated amorphized silicon (a-Si) nano-grains is selected from the group comprising a rectangular cross section, with the longitudinal axis of the rectangle oriented vertically, a triangular cross section with an apex portion of the triangle disposed toward said front face of said emitter, an ovoid with the longitudinal ax-is of the ovoid oriented vertically, a T-shaped cross-sectional configuration, a D-shaped cross-sectional configuration, and a C-shaped cross-sectional configuration.

3. The architectural system as set forth in claim 1, wherein:
   said at least one layer of amorphized silicon (a-Si) nanograins comprises a plurality of layers of amorphized silicon (a-Si) nanograins wherein said plurality of layers of amorphized silicon (a-Si) nanograins are vertically separated from each other and comprise an uppermost layer of amorphized silicon (a-Si) nanograins disposed closest to said front face portion of said emitter while other layers of said plurality of layers of amorphized silicon (a-Si) nanograins are disposed beneath said uppermost layer of amorphized silicon (a-Si) nanograins and are disposed throughout said emitter.

4. The architectural system as set forth in claim 3, wherein:
   each one of said plurality of horizontally separated amorphized silicon (a-Si) nanograins disposed within said uppermost layer of amorphized silicon (a-Si) nanograins disposed closest to said front face portion of said emitter comprise a predetermined vertically elongated geometrical configuration selected from the group comprising a rectangular cross section, with the longitudinal axis of the rectangle oriented vertically, and a triangular cross section with an apex portion of the triangle disposed toward said front face of said emitter;
   each one of said plurality of horizontally separated amorphized silicon (a-Si) nanograins disposed within said other ones of said plurality of layers of amorphized silicon (a-Si) nanograins disposed beneath said uppermost layer of amorphized silicon (a-Si) nanograins have a predetermined geometrical configuration selected from the group comprising a rectangular cross section, with the longitudinal axis of the rectangle oriented vertically, a rectangular cross-section, with the longitudinal axis of the rectangle oriented horizontally, a triangular cross section with an apex portion of the triangle disposed toward said front face of said emitter, a triangular cross-section with an apex portion of the triangle disposed away from said front face of said emitter, a circular cross-section, an ovoid cross-section, a T-shaped cross-sectional configuration, a D-shaped cross-sectional configuration, and a C-shaped cross-sectional configuration.

5. The architectural system as set forth in claim 3, wherein:
a particular layer of said plurality of layers of amorphized silicon (a-Si) nanograins has a different number of amorphized silicon (a-Si) nanograins comprising said particular layer of amorphized silicon (a-Si) nanograins as compared to the number of amorphized silicon (a-Si) nanograins comprising another one of said plurality of layers of amorphized silicon (a-Si) nanograins.

6. The architectural system as set forth in claim 3, wherein:
the plurality of amorphized silicon (a-Si) nanograins disposed within said plurality of layers of amorphized silicon (a-Si) nanograins are all vertically aligned with each other.

7. The architectural system as set forth in claim 3, wherein:
the plurality of amorphized silicon (a-Si) nanograins disposed within said plurality of layers of amorphized silicon (a-Si) nanograins are vertically misaligned with respect to each other.

8. The architectural system as set forth in claim 1, further comprising:
first nanomembranes separating said unstressed crystalline silicon (c-Si) regions of said emitter from stressed crystalline silicon (<c-Si>) regions of said emitter; and
second nanomembranes separating said amorphized silicon (a-Si) nano-grains from said stressed crystalline silicon (<c-Si>) regions of said emitter.

9. The architectural system as set forth in claim 1, wherein:
the entire emitter volume occupied by said amorphized silicon (a-Si) nanograins is delimited by two semiconductor interface nanomembranes resulting from a predetermined doping profile.

10. A method of forming an architectural system defined within an emitter space of a semiconductor light-to-electricity converter, comprising the steps of:
providing a front electrode;
providing a rear electrode;
providing a base portion disposed adjacent to said rear electrode;
providing an emitter, comprising crystalline silicon (c-Si), disposed adjacent to said front electrode and having a front face portion;
providing a PN junction interposed between said base portion and said emitter; and
providing at least one layer of amorphized silicon (a-Si) nanograins comprising a plurality of horizontally separated amorphized silicon (a-Si) nanograins disposed within an upper region of said emitter so as to be close to said front face portion of said emitter, each one of said plurality of horizontally separated amorphized silicon (a-Si) nanograins having a predetermined vertically elongated geometrical configuration such that a relatively small upper surface area is disposed toward said front face of said emitter while a relatively large body surface area of each one of said amorphized silicon (a-Si) nanograins is disposed within said emitter, and wherein each one of said plurality of horizontally separated amorphized silicon (a-Si) nanograins is enveloped within a coating of metamaterial such that when said light-to-electricity converter is exposed to incident light, only a small part of the incident light is absorbed within the amorphized matter comprising said plurality of amorphized silicon (a-Si) nanograins as a result of only said relatively small upper surface area being exposed to incoming photons, while hot electrons, generated by energetic photons entering said emitter and moving in all directions within said emitter, will massively collide with said plurality of horizontally separated, vertically elongated amorphized silicon (a-Si) nanograins so as to result in vastly multiplied secondary electron generation.

11. The method as set forth in claim 10, wherein:
said predetermined vertically elongated geometrical configuration of each one of said plurality of horizontally separated amorphized silicon (a-Si) nano-grains is selected from the group comprising a rectangular cross section, with the longitudinal axis of the rectangle oriented vertically, a triangular cross section with an apex portion of the triangle disposed toward said front face of said emitter, an ovoid with the longitudinal ax-is of the ovoid oriented vertically, a T-shaped cross-sectional configuration, a D-shaped cross-sectional configuration, and a C-shaped cross-sectional configuration.

12. The method as set forth in claim 10, wherein:
said at least one layer of amorphized silicon (a-Si) nanograins comprises a plurality of layers of amorphized silicon (a-Si) nanongrains wherein said plurality of layers of amorphized silicon (a-Si) nanograins are vertically separated from each other and comprise an uppermost layer of amorphized silicon (a-Si) nanograins disposed closest to said front face portion of said emitter while other layers of said plurality of layers of amorphized silicon (a-Si) nanongrains are dis-posed beneath said uppermost layer of amorphized silicon (a-Si) nanograins and are disposed throughout said emitter.

13. The method as set forth in claim 12, wherein:
each one of said plurality of horizontally separated amorphized silicon (a-Si) nanograins disposed within said uppermost layer of amorphized silicon (a-Si) nanograins disposed closest to said front face portion of said emitter comprise a predetermined vertically elongated geometrical configuration selected from the group comprising a rectangular cross section, with the longitudinal axis of the rec- tangle oriented vertically, and a triangular cross section with an apex portion of the triangle disposed toward said front face of said emitter; and
each one of said plurality of horizontally separated amorphized silicon (a-Si) nanograins disposed within said other ones of said plurality of layers of amorphized silicon (a-Si) nanograins disposed beneath said uppermost layer of amorphized silicon (a-Si) nanograins have a predetermined geometrical configuration selected from the group comprising a rectangular cross section, with the longitudinal axis of the rectangle oriented vertically, a rectangular cross-section, with the longitudinal axis of the rectangle oriented horizontally, a triangular cross section with an apex portion of the triangle disposed toward said front face of said emitter, a triangular cross-section with an apex portion of the triangle disposed away from said front face of said emitter, a circular cross-section, an ovoid cross-section, a T-shaped cross-sectional configuration, a D-shaped cross-sectional configuration, and a C-shaped cross-sectional configuration.

14. The method as set forth in claim 12, wherein:
a particular layer of said plurality of layers of amorphized silicon (a-Si) nanograins has a different number of amorphized silicon (a-Si) nanograins comprising said particular layer of amorphized silicon (a-Si) nanograins as compared to the number of amorphized silicon (a-Si) nanograins comprising another one of said plurality of layers of amorphized silicon (a-Si) nanograins.

15. The method as set forth in claim 12, wherein:
the plurality of amorphized silicon (a-Si) nanograins disposed within said plurality of layers of amorphized silicon (a-Si) nanograins are all vertically aligned with each other.

16. The method as set forth in claim 12, wherein:
the plurality of amorphized silicon (a-Si) nanograins disposed within said plurality of layers of amorphized silicon (a-Si) nanograins are vertically mis-aligned with respect to each other.

17. The method as set forth in claim 10, further comprising:
first nanomembranes separating said unstressed crystalline silicon (c- Si) regions of said emitter from stressed crystalline silicon (<c-Si>) regions of said emitter; and
second nanomembranes separating said amorphized silicon (a-Si) nano-grains from said stressed crystalline silicon (<c-Si>) regions of said emitter.

18. The method as set forth in claim 10, wherein:
the entire emitter volume occupied by said amorphized silicon (a-Si) nanograins is delimited by two semiconductor interface nanomembranes resulting from a predetermined doping profile.

\* \* \* \* \*